US007863743B1

United States Patent
Shi et al.

(10) Patent No.: US 7,863,743 B1
(45) Date of Patent: Jan. 4, 2011

(54) CAPACTIVE CONNECTORS WITH ENHANCED CAPACITIVE COUPLING

(75) Inventors: Jing Shi, San Diego, CA (US); Darko R. Popovic, San Diego, CA (US); Ashok V. Krishnamoorthy, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 0 days.

(21) Appl. No.: 12/494,981

(22) Filed: Jun. 30, 2009

(51) Int. Cl.
*H01L 23/48* (2006.01)

(52) U.S. Cl. .................................................. 257/739

(58) Field of Classification Search .................. 257/739
See application file for complete search history.

(56) References Cited

U.S. PATENT DOCUMENTS

| | | | | |
|---|---|---|---|---|
| 5,357,136 | A * | 10/1994 | Yoshioka | 257/383 |
| 6,828,678 | B1 * | 12/2004 | Koutny, Jr. | 257/739 |
| 6,984,895 | B2 * | 1/2006 | Cho et al. | 257/781 |
| 7,015,580 | B2 * | 3/2006 | Fitzsimmons et al. | 257/739 |
| 7,233,067 | B2 * | 6/2007 | Takano | 257/737 |
| 7,679,084 | B2 * | 3/2010 | Choo et al. | 257/59 |
| 2001/0054908 | A1 * | 12/2001 | Farnworth et al. | 324/755 |

* cited by examiner

*Primary Examiner*—Scott B Geyer
(74) *Attorney, Agent, or Firm*—Park, Vaughan, Fleming & Dowler LLP; Steven E. Stupp (57) ABSTRACT

A single-chip module (SCM) and a multi-chip module (MCM) that includes at least two instances of the SCM are described. The SCM includes a pad disposed on a substrate. This pad has a top surface that includes a pattern of features. A given feature in the pattern of features has a height that extends above a minimum thickness of the pad, thereby increasing a capacitance associated with the pad relative to a configuration in which the top surface is planar. Furthermore, pads disposed on the two instances of the SCM in the MCM may each have a corresponding pattern of features that increases the capacitive coupling between the pads relative to a configuration in which the top surfaces of either or both of the pads are planar. Note that the pads may be aligned such that features in the patterns of features on these pads are interdigited with each other.

20 Claims, 6 Drawing Sheets

CAPACITIVE CONNECTORS WITH ENHANCED CAPACITIVE COUPLING

BACKGROUND

1. Field

The present disclosure relates to devices that communicate signals via capacitive coupling. More specifically, the present disclosure relates to devices that include connectors with features that enhance capacitive coupling with corresponding connectors on other devices.

2. Related Art

As integrated-circuit (IC) technology continues to scale to smaller critical dimensions, it is increasingly difficult for existing inter-chip connections to provide desired characteristics, such as: high bandwidth, low power, reliability and low cost. Several technologies have been proposed to address this problem, including proximity communication or PxC (for example, using capacitive inter-chip pads or connectors).

A PxC communication system based on capacitive inter-chip connectors provides dense inter-chip connections, with a pitch between neighboring connectors on the order of 10-100 µm. However, the capacitive coupling of AC signals between the inter-chip connectors, and thus the performance of a PxC communication system (such as the signal-to-noise ratio and bit-error rate), are sensitive to changes in the capacitance between the inter-chip connectors. This capacitance is small, and decreases as the spacing between the inter-chip connectors increases. For example, in a PxC communication system with a connector area of 106×106 µm$^2$, a connector pitch of 106 µm and a capacitance of 500 fF, the bit-error rate is estimated to increase by a factor of $10^{20}$ as the spacing between the inter-chip connectors increases from 7 to 12 µm.

In contrast, the capacitive coupling of AC signals can be increased, and the performance of the PxC communication system can be improved, if the capacitance of the inter-chip connectors is increased. For example, the capacitance can be increased by increasing the connector sizes. However, larger connector sizes reduce the density of inter-chip connections, which is one of the advantages of PxC communication. Furthermore, as critical dimensions are scaled in semiconductor technology, the connector size is reduced. Because it is difficult to decrease the spacing between the inter-chip connectors, it may therefore be difficult to maintain the ratio of the connector area to the spacing between connectors on neighboring chips, which typically results in smaller capacitance, with a commensurate decrease in performance.

Hence, what is needed are devices with inter-chip connectors for use in PxC communication without the problems described above.

SUMMARY

One embodiment of the present disclosure provides a single-chip module (SCM) that includes a substrate having a first surface, and a pad disposed on the first surface. This pad has a top surface that includes a pattern of features. Moreover, a given feature in the pattern of features has a height that extends above a minimum thickness of the pad, thereby increasing a capacitance associated with the pad relative to a configuration in which the top surface is planar.

Note that the height may be greater than or equal to a predetermined fraction of a length of a side of the pad. Furthermore, the given feature may have a rectangular shape and/or a cylindrical shape.

In some embodiments, the pattern of features is periodic along a first direction in a plane defined by the top surface and/or is periodic along a second direction in the plane. For example, the pattern of features may include a first minimum spatial frequency along the first direction and/or a second minimum spatial frequency along the second direction. Note that the second direction may be approximately perpendicular to the first direction.

Additionally, the pattern of features may correspond to a continuous function along the first direction in the plane. For example, the continuous function may include a trigonometric function.

Alternatively, the pattern of features may include random positions of the features in the plane.

In some embodiments, the SCM includes a dielectric layer coupled to the top surface. This dielectric layer may have a planar top surface.

Another embodiment provides a multi-chip module (MCM), which includes two instances of the SCM. Pads disposed on these two instances may each have a corresponding pattern of features that increases the capacitive coupling between the pads relative to a configuration in which the top surfaces of either or both of the pads are planar. Note that the pads may be aligned such that features in the patterns of features on these pads are interdigited with each other.

In some embodiments, the MCM may include the dielectric layer between the pads. Furthermore, a ratio of a spacing between top surfaces of the pads to the height of features on either or both pads may be greater than or equal to one.

Another embodiment provides a computer system that includes the MCM.

Another embodiment provides a method for fabricating the pattern of features on the pad disposed on the SCM.

BRIEF DESCRIPTION OF THE FIGURES

Table 1 provides simulated capacitance in embodiments of the proximity connectors in the MCM of FIG. 2A.

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a single-chip module (SCM), a multi-chip module (MCM) that includes at least two instances of the SCM, a computer system that includes the MCM, and a method for fabricating a pad disposed on the SCM are described. This SCM includes a pad disposed on a substrate. This pad has a top surface that includes a pattern of features. A given feature in the pattern of features has a height that extends above a minimum thickness of the pad, thereby increasing a capacitance associated with the pad relative to a configuration in which the top surface is planar. Furthermore, pads disposed on the two instances of the SCM in the MCM may each have a corresponding pattern of features that increases the capacitive coupling between the pads relative to a configuration in which the top surfaces of either or both of the pads are planar. Note that the pads may be aligned such that features in the patterns of features on these pads are interdigited with each other. By increasing the capacitance of the pad(s), the SCM improves the performance of proximity-communication (PxC) systems, such as the MCM.

We now describe embodiments of the SCM and the MCM. The capacitance C between two parallel, planar plates can be expressed as $$C = \frac{\varepsilon_r \cdot \varepsilon_o \cdot A}{d}, \quad (1)$$

where $\varepsilon_r$ is the dielectric constant of the material between the planar plates, $\varepsilon_o$ is the permittivity of free space (8.85 pF/m), A is the area of each planar plate, and d is the spacing between the parallel, planar plates. As shown in Eqn. 1, the capacitance can be increased by: increasing the dielectric constant, increasing the area, and/or decreasing the spacing. However, in many PxC systems the area is decreased as the critical dimension during fabrication is scaled down. Furthermore, because the spacing is often defined by a bondline thickness, it can be difficult to concurrently scale the spacing such that the ratio of the area to the spacing is at least constant (if not increased). In the discussion that follows, the capacitance (and thus, the capactive coupling) is increased by increasing the effective area of proximity connectors and/or through the use of high dielectric constant materials between inter-chip proximity connectors.

Figure 1A:
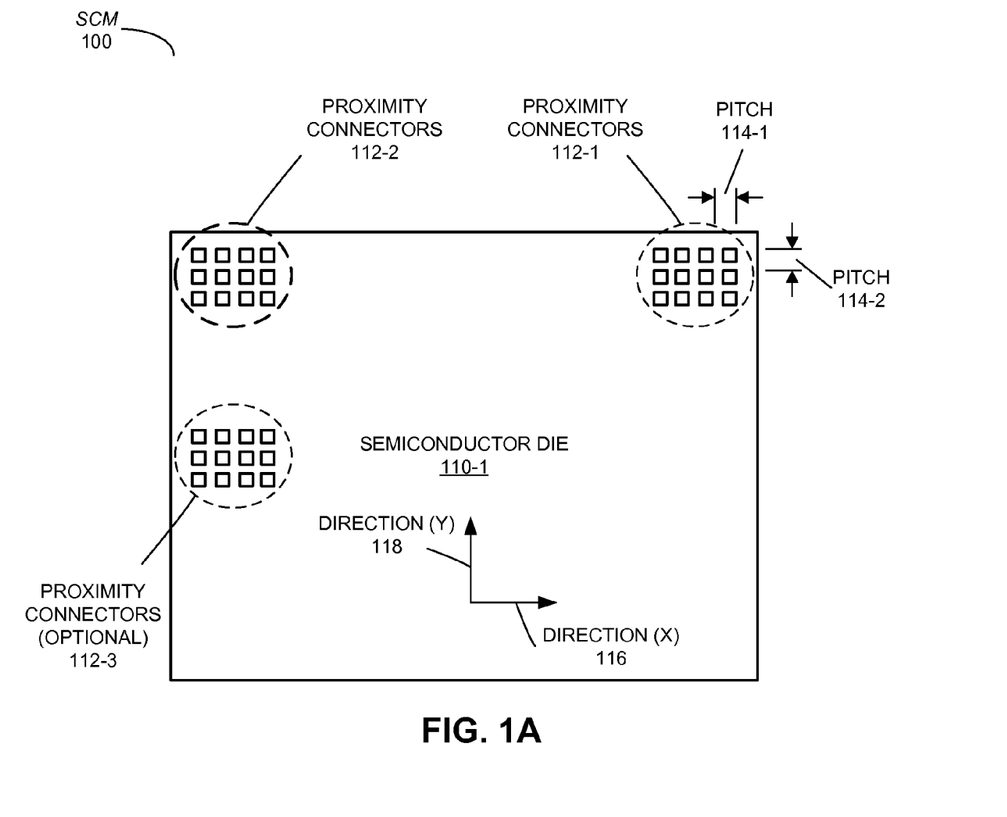
FIG. 1A is a block diagram illustrating a single-chip module (SCM) in accordance with an embodiment.

FIG. 1A presents a block diagram illustrating a top view of SCM 100, which includes one or more proximity connectors 112 (such as capacitance-based connectors) in transmitter and/or receiver arrays disposed on a substrate, such as semiconductor die 110-1. This semiconductor die may include layers that implement integrated circuit electronics. Note that when packaged in SCM 100, semiconductor die 110-1 is sometimes referred to as a "chip."

In some embodiments, proximity connectors 112 are located on or proximate to at least one surface of semiconductor die 110-1. However, in other embodiments, semiconductor die 110-1 is coupled to the proximity connectors 112. In an exemplary embodiment, proximity connectors 112 are substantially located at or near one or more corners (proximity connectors 112-1 and 112-2) and/or edges (proximity connectors 112-3) of semiconductor die 110-1. In other embodiments, proximity connectors 112 are situated at one or more arbitrary locations on, or proximate to, the surface of semiconductor die 110-1.

As illustrated for proximity connectors 112-1, there is a first pitch 114-1 between adjacent connectors or pads in a first direction (X) 116 of the surface and a second pitch 114-2 between adjacent connectors or pads in a second direction (Y) 118 of the surface. In some embodiments, the first pitch 114-1 and the second pitch 114-2 are approximately equal.

Figure 1B:
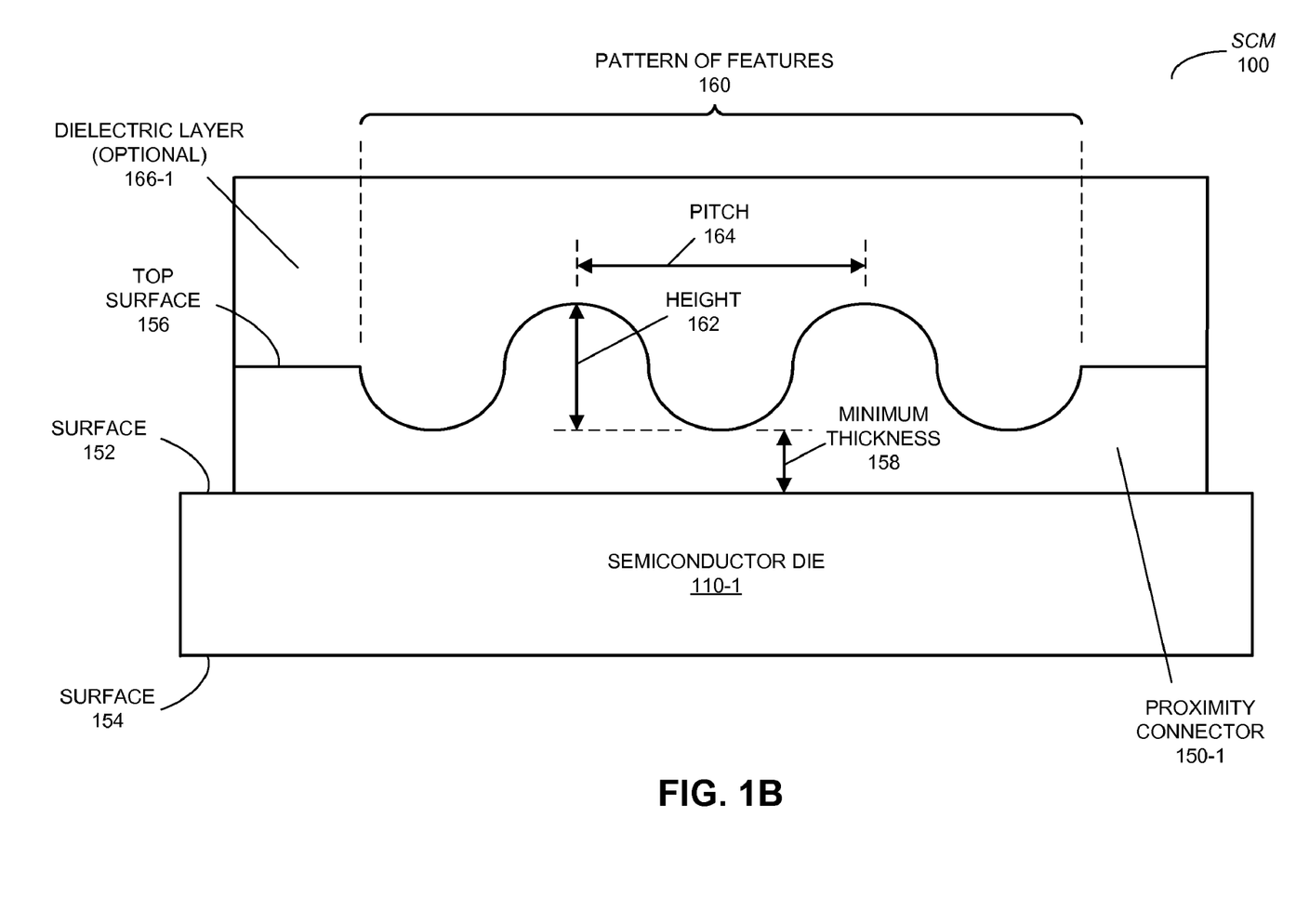
FIG. 1B is a block diagram illustrating a proximity connector in the SCM of FIG. 1A in accordance with an embodiment.

FIG. 1B presents a block diagram illustrating a side view of a proximity connector 150-1 in SCM 100 (FIG. 1A). This proximity connector is disposed on one of surfaces 152 and 154 of semiconductor die 110-1 (in this case, on surface 152). Furthermore, a top surface 156 of proximity connector 150-1 includes a pattern of features 160. A given feature in this pattern of features has a height 162 that extends above a minimum thickness 158 of proximity connector 150-1.

Note that the given feature may have: a rectangular shape, a cylindrical shape, a hexagonal shape and/or an arbitrary shape. In some embodiments, pattern of features 160 may correspond to a continuous function along one or more directions in the plane of top surface 156. For example, the continuous function may include a trigonometric function, such as a sine function. Consequently, pattern of features 160 may be periodic, and the horizontal spacing or pitch 164 between the hills and valleys along a particular direction, such as direction (X) 116 (FIG. 1A), may correspond to a minimum spatial frequency associated with this periodic pattern. In some embodiments, there is also a minimum spatial frequency associated with the pattern of features 160 along direction (Y) 118 (FIG. 1A). Alternatively, features in pattern of features 160 may be at random positions in the plane of top surface 156.

Thus, pattern of features 160 may be 3-dimensional (3-D), with height 162 between hills and valleys. This height may be greater than or equal to a predetermined fraction of a length of a side of proximity connector 150-1, such as 5%.

As described further below with reference to Table 1, features in pattern of features 160 significantly increase the effective surface area of proximity connector 150-1 (even though its footprint is unchanged) and/or reduce the effective spacing with a proximity connector on another chip. As a consequence, pattern of features 160 increases a capacitance associated with proximity connector 150-1 relative to a configuration in which top surface 156 is planar. For example, the capacitance may be increased by up to 70%.

In some embodiments, SCM 100 includes an optional dielectric layer 166 disposed on top surface 156. This optional dielectric layer may have a planar top surface.

Figure 2A:
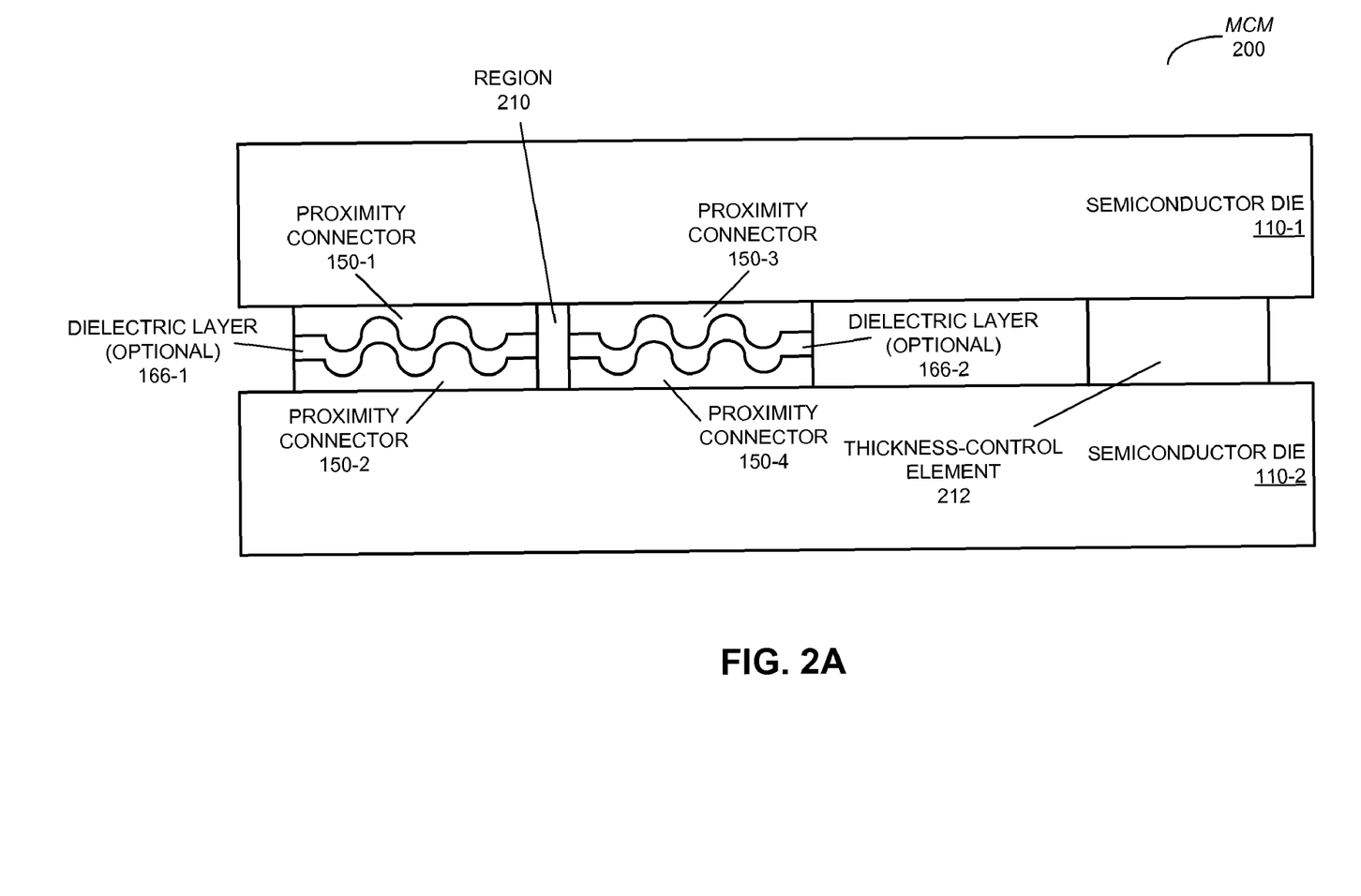
FIG. 2A is a block diagram illustrating a multi-chip module (MCM) in accordance with an embodiment.

Two or more instances of SCM 100 may be included in an MCM. This is shown in FIG. 2A, which presents a block diagram illustrating MCM 200. Proximity connectors 150 on semiconductor dies 110 in these two instances may each have a corresponding pattern of features that increases the capacitive coupling between the proximity connectors 150 relative to a configuration in which the top surfaces of either or both of the proximity connectors are planar. Note that proximity connectors 150 may be aligned such that features in the patterns of features on these proximity connectors are interdigited with each other.

In addition to increasing the capacitance between proximity connectors 150 by increasing the effective area, PxC communication performance can be increased by including optional dielectric layers 166 between pairs of proximity connectors 150. In particular, these optional dielectric layers 166 may include a material with a high dielectric constant (such as hafnium oxide). Furthermore, PxC communication performance can also be increased by using a material with a low dielectric constant in regions (such as region 210) between pairs of proximity connectors 150 to reduce crosstalk. For example, regions, such as region 210, may be underfilled or may be filled by air.

In some embodiments, the spacing between semiconductor dies 110 is defined by thickness-control element 212. For example, thickness-control element 212 may be microsolder and/or another bondline-control material. Note that the height of the microsolder (after compression) defines: the baseline separation between semiconductor dies 110, the resulting bondline thickness of the bonded chips, and thus, the spacing between proximity connectors 150. Using a microsolder flip-chip bonding process, the bondline thickness may be controlled to within 2-4 μm. As described further below with reference to Table 1, the increase in the capacitance associated with the patterns of features will increase as the bondline thickness decreases (as long as proximity connectors 150 are not in direct contact with each other).

Figure 2B:
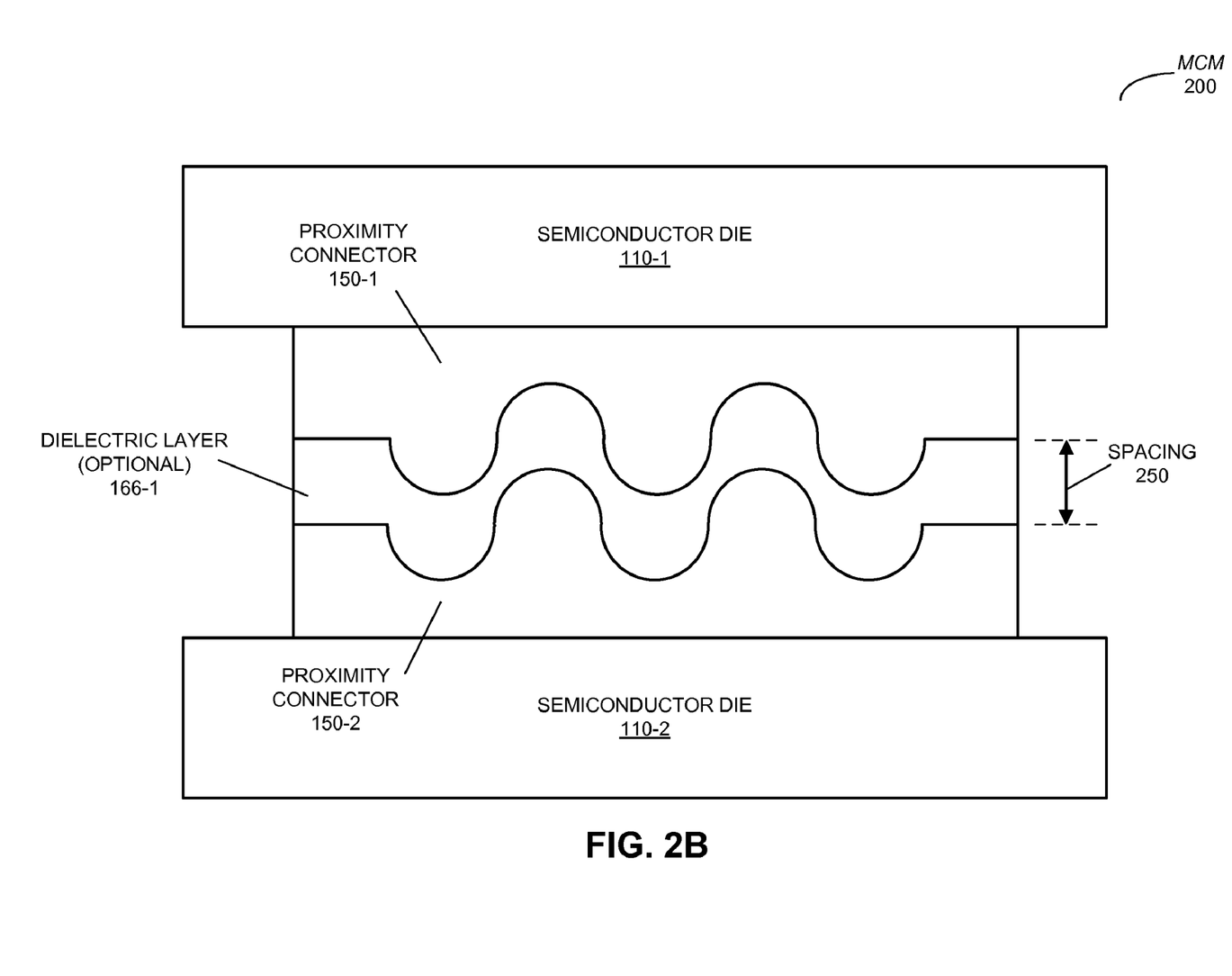
FIG. 2B is a block diagram illustrating capacitively coupled proximity connectors in the MCM of FIG. 2A in accordance with an embodiment.

FIG. 2B presents a block diagram illustrating a closer view of proximity connectors 150 in MCM 200 (FIG. 2A). Note that the top surfaces of proximity connectors 150 are separated by spacing 250. As described further below with reference to Table 1, a ratio of the spacing 250 to the height of features on either or both proximity connectors 150 may be greater than or equal to one.

Alignment between semiconductor dies 110 in MCM 200 may be accomplished in a variety of ways. For example, adhesive preparation of semiconductor dies 110 may occur prior to mating. Then, MCM 200 may be assembled using pick-and-place alignment of semiconductor dies 110. Alternatively or additionally, reflowed solder connections (e.g., C4) may be used to connect semiconductor dies 110 and, based on the surface tension of the liquid solder, to provide self-alignment. Another assembly technique involves etching pits on the bottom surface of top substrate 110-1 (for example, using front-to-back photolithographic alignment) and etching pits on the top surface of bottom substrate 110-2. Then, semiconductor dies 110 may be aligned using a ball-in-pit alignment technique as semiconductor dies 110 are assembled to create MCM 200.

The increase in the capacitance associated with pattern of features 160 (FIG. 1B) was simulated using an electronic-design-automation model of proximity connectors 150. In these simulations, each proximity connector had an area of 30×30 μm$^2$ and a minimum thickness 158 (FIG. 1B) of 2 μm. These proximity connectors each had a pattern of features that included half cylindrical hillocks, with a pitch 164 (FIG. 1B) of the repetitive features of 4 μm, and height 162 (FIG. 1B) of 2 μm. Furthermore, spacing 250 (such as the bondline thickness) between semiconductor dies 110 in MCM 200 was varied between 2 to 16 μm. (Note that spacing 250 was greater than or equal to height 162 (FIG. 1B) to eliminate DC contacts in the extreme case in which features on proximity connectors 150 were aligned peak-to-peak.) For purposes of comparison, the capacitance of planar, parallel plates having the same area and spacing was also simulated.

Table 1 provides the simulated capacitance results. For spacing (d) 250 of 16 μm, there is a 9% increase in the capacitance of the patterned proximity connectors (Cpatterned) relative to the capacitance of the planar proximity connectors (Cplanar). As spacing 250 is decreased, the capacitance-enhancement dramatically increases. For example, when spacing 250 is halved, the enhancement is more than doubled. This is because the pattern of features on proximity connectors 150 increases the effective area of proximity connectors 150, and because the hillocks on each of proximity connectors 150 decrease the effective spacing 250 between proximity connectors 150. When the ratio d/h of spacing 250 to height (h) 162 (FIG. 1B) is between 1 and 4, the simulations predict a substantial enhancement in the capacitively coupled AC signals between proximity connectors 150.

TABLE 1

| d (μm) | d/h (μm) | Cplanar (fF) | Cpatterned (fF) | Enhancement (%) |
|---|---|---|---|---|
| 2 | 1 | 4.73 | 8.46 | 79 |
| 4 | 2 | 2.58 | 3.44 | 33 |
| 8 | 4 | 1.44 | 1.66 | 15 |
| 16 | 8 | 0.081 | 0.088 | 9 |

Figure 3:
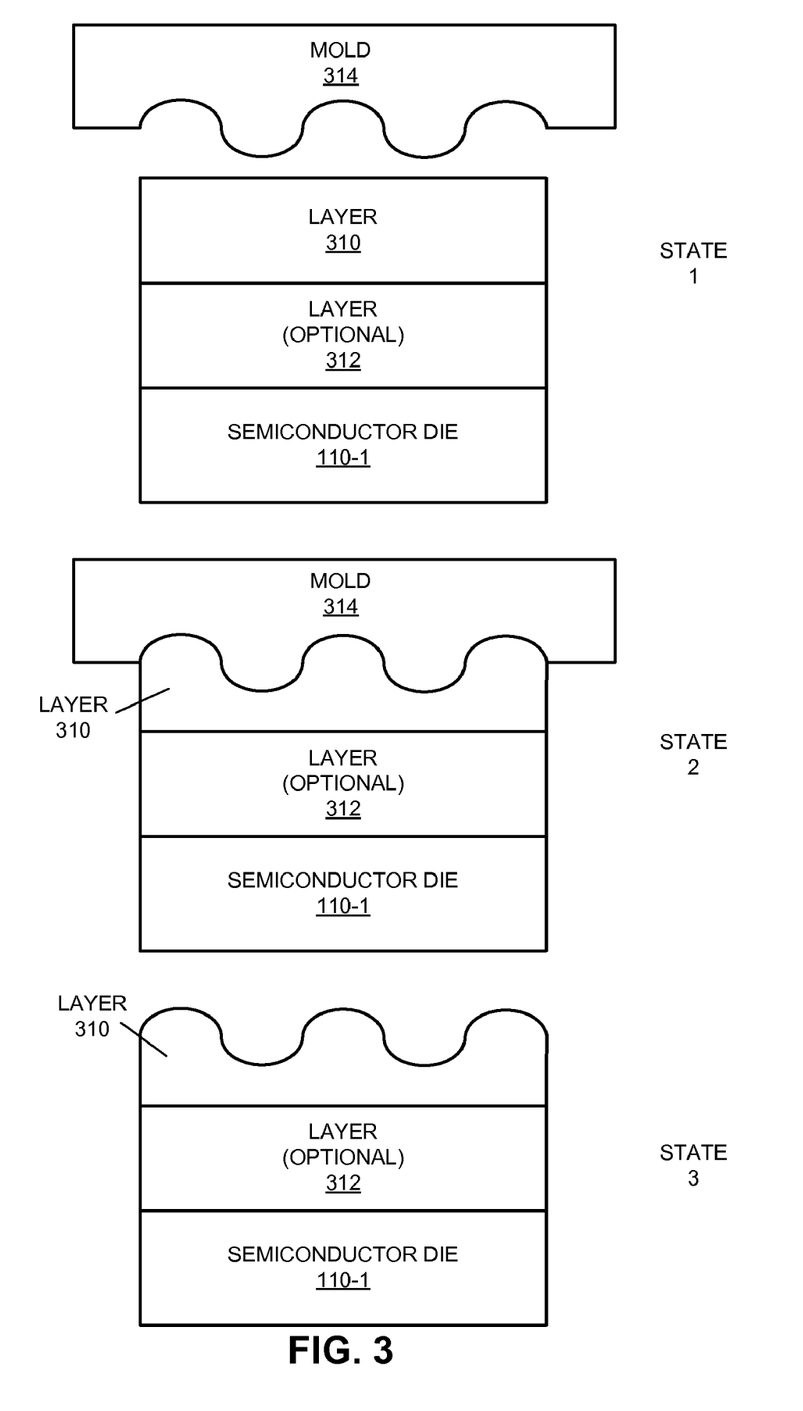
FIG. 3 is a block diagram illustrating states in a process for fabricating features on a proximity connector in accordance with an embodiment.

We now describe embodiments of a process for fabricating a pattern of features on a proximity connector in an SCM. FIG. 3 presents a block diagram illustrating states 1-3 during an embodiment of a process for fabricating features on a proximity connector in SCM 100 (FIG. 1B). Relative to the process for fabricating a planar proximity connector, there may be one additional operation when fabricating a patterned proximity connector (i.e., one that includes pattern of features 160 in FIG. 1B). In particular, a 3-D pattern may be transferred to layer 310 using a mold 314 (such as a quartz or silicon mold) that is pressed into the work piece (which is sometimes referred to as 'imprinting'). Note that layer 310 may be: resist, metal and/or a ferroelectric material. In some embodiments, layer 310 is a metal that is deposited on optional layer 312, which may be a ferroelectric material. Furthermore, the imprinting may be performed at elevated temperature or at room temperature, using low or high pressure (such as 14 MPa or 20 MPa).

In some embodiments, layer 310 is aluminum or copper. However, imprinting on aluminum and/or copper may require high pressure and/or high temperature (relative to atmospheric pressure and room temperature, respectively). Alternatively, layer 310 may be a malleable metal (such as silver, gold or indium) that is deposited on optional layer 312, which may be aluminum or copper. Note that layer 310 may be deposited using sputtering or evaporation.

After depositing layer 310, a high dielectric constant material, such as optional dielectric layer 166-1 (FIG. 1B), can be spun on or deposited using chemical vapor deposition (CVD). Subsequently, layer 310 may be etched. Furthermore, a low dielectric constant material can be underfilled and/or patterned in regions, such as region 210 (FIG. 2A), after the high dielectric constant material has been deposited and/or etched.

In some embodiments of the process illustrated in FIG. 3 there may be additional or fewer operations. For example, while FIG. 3 illustrates an imprinting process, in other embodiments features in pattern of features 160 (FIG. 1B) may be defined by removing material from (for example, using photolithography) and/or adding material to semiconductor die 110-1 (for example, during a build-up process). Moreover, the order of the operations may be changed and/or two or more operations may be combined into a single operation. Although this disclosure describes particular processing techniques for fabricating the features, this disclosure more generally allows a wide variety of processing techniques, known to one of skill in the art, to be used in fabricating an arbitrary feature shape and/or an arbitrary pattern of features 160 (FIG. 1B).

Figure 4:
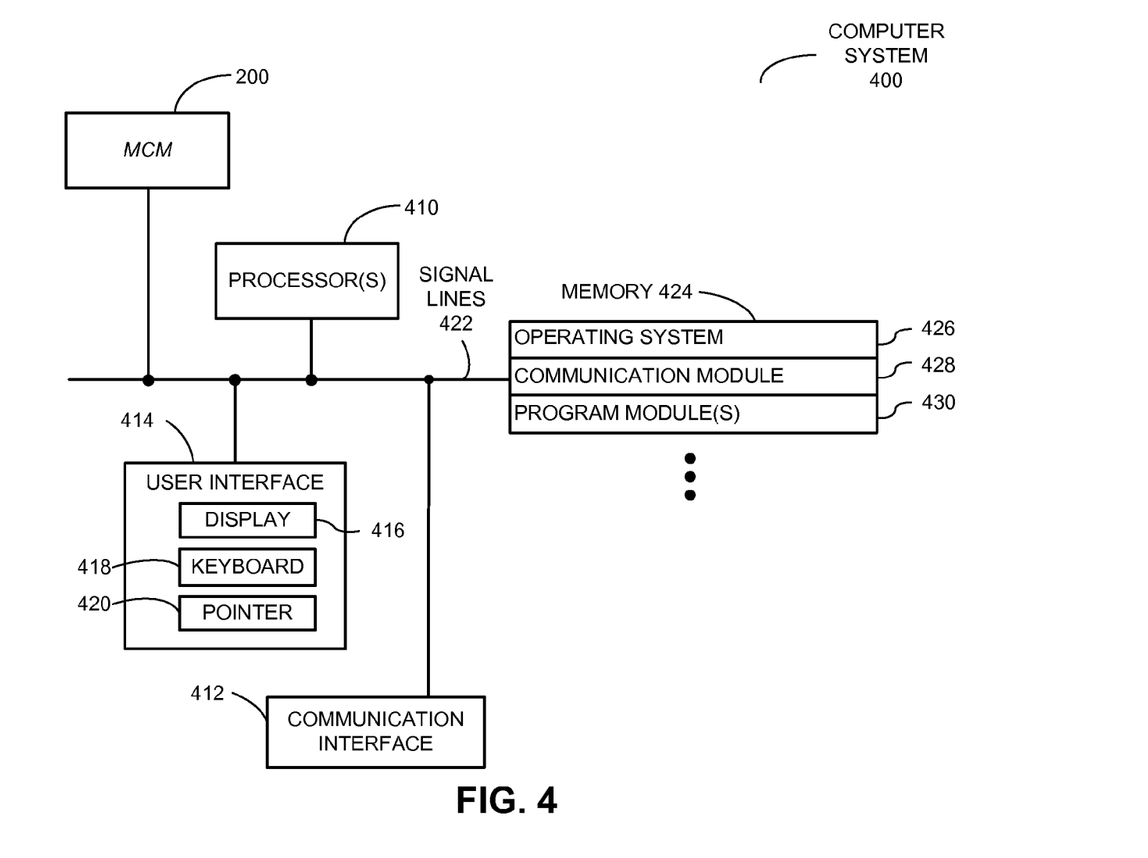
FIG. 4 is a block diagram illustrating a computer system that includes the MCM of FIG. 2A in accordance with an embodiment.

We now describe a computer system that includes an MCM. FIG. 4 presents a block diagram illustrating a computer system 400 that includes at least one MCM, such as MCM 200 (FIG. 2A). FIG. 4 presents a block diagram illustrating a computer system 400 that includes MCM 200. Computer system 400 includes: one or more processors (or processor cores) 410, a communication interface 412, a user interface 414, and one or more signal lines 422 coupling these components together. Note that the one or more processors (or processor cores) 410 may support parallel processing and/or multi-threaded operation, the communication interface 412 may have a persistent communication connection, and the one or more signal lines 422 may constitute a communication bus. Moreover, the user interface 414 may include: a display 416, a keyboard 418, and/or a pointer 420, such as a mouse.

Memory 424 in the device 400 may include volatile memory and/or non-volatile memory. More specifically, memory 424 may include: ROM, RAM, EPROM, EEPROM, flash, one or more smart cards, one or more magnetic disc storage devices, and/or one or more optical storage devices. Memory 424 may store an operating system 426 that includes procedures (or a set of instructions) for handling various basic system services for performing hardware-dependent tasks. Moreover, memory 424 may also store communication procedures (or a set of instructions) in a communication module 428. These communication procedures may be used for communicating with one or more computers, devices and/or servers, including computers, devices and/or servers that are remotely located with respect to the device 400.

Memory 424 may also include one or more program modules 430 (or a set of instructions). Note that one or more of program modules 430 may constitute a computer-program mechanism. Instructions in the various modules in the memory 424 may be implemented in: a high-level procedural language, an object-oriented programming language, and/or in an assembly or machine language. The programming language may be compiled or interpreted, i.e., configurable or configured, to be executed by the one or more processors (or processor cores) 410.

Note that the one or more semiconductor dies 110 (FIG. 2A) may be included in MCM 200 (which may function as a switch or a processor). For example, this MCM may include an array of chip modules (CMs) or single-chip modules (SCMs), and a given SCM may include at least one semiconductor die. Note that the MCM is sometimes referred to as a 'macro-chip.' Furthermore, the semiconductor die may communicate with other semiconductor dies, CMs, SCMs, and/or devices in the MCM using PxC of electromagnetically coupled signals (which is referred to as 'electromagnetic PxC'), such as capacitively coupled signals and/or PxC of optical signals (which are, respectively, referred to as 'electrical PxC' and 'optical PxC'). In some embodiments, the electromagnetic PxC includes inductively coupled signals and/or conductively coupled signals.

Computer system 400 may include, but is not limited to: a server, a laptop computer, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. For example, MCM 200 may be included in a backplane that is coupled to multiple processor blades, or MCM 200 may couple different types of components (such as processors, memory, I/O devices, and/or peripheral devices). Thus, MCM 200 may perform the functions of: a switch, a hub, a bridge, and/or a router. Note that computer system 400 may be at one location or may be distributed over multiple, geographically dispersed locations.

SCM 100 (FIGS. 1A and 1B), MCM 200 and/or computer system 400 may include fewer components or additional components. For example, in some embodiments only the proximity connector disposed on one of semiconductor dies 110 (FIG. 2A) includes the pattern of features, while the proximity connector disposed on the other of semiconductor dies 110 (FIG. 2A) may be planar. In addition, as known to one of skill in the art, a wide variety of manufacturing tools and techniques may be used to fabricate these features, including: sputtering, evaporation, isotropic etching, anisotropic etching, lift-off techniques, photo-lithography, and/or mask-less lithography.

Moreover, although these components and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. Note that some or all of the functionality of the computer system 400 may be implemented in one or more application-specific integrated circuits (ASICs) and/or one or more digital signal processors (DSPs). Furthermore, functionality in SCM 100 (FIGS. 1A and 1B), MCM 200 and/or computer system 400 may be implemented more in hardware and less in software, or less in hardware and more in software, as is known in the art.

While the preceding discussion has used PxC as an illustration, the patterned pads or connectors may be used in a wide variety of applications where increased capacitance per unit area of the pads or connectors is useful, including applications in which there is an integrated capacitor disposed on a substrate, as well applications with a discrete capacitor.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A single-chip module (SCM), comprising:
   a substrate having a first surface; and
   a pad, disposed on the first surface, wherein the pad has a top surface that includes a pattern of features, and
   wherein a given feature in the pattern of features has a height that extends above a minimum thickness of the pad, thereby increasing a capacitance associated with the pad relative to a configuration in which the top surface is planar.

2. The SCM of claim 1, wherein the height is greater than or equal to a predetermined fraction of a length of a side of the pad.

3. The SCM of claim 1, wherein the given feature has a rectangular shape.

4. The SCM of claim 1, wherein the given feature has a cylindrical shape.

5. The SCM of claim 1, wherein the pattern of features is periodic along a first direction in a plane defined by the top surface.

6. The SCM of claim 5, wherein the pattern of features includes a minimum spatial frequency along the first direction.

7. The SCM of claim 5, wherein the pattern of features is periodic along a second direction in the plane.

8. The SCM of claim 7, wherein the pattern of features includes a minimum spatial frequency along the second direction.

9. The SCM of claim 7, wherein the second direction is approximately perpendicular to the first direction.

10. The SCM of claim 1, wherein the pattern of features corresponds to a continuous function along a first direction in a plane defined by the top surface.

11. The SCM of claim 10, wherein the continuous function includes a trigonometric function.

12. The SCM of claim 1, wherein the pattern of features includes random positions of the features in a plane defined by the top surface.

13. The SCM of claim 1, further comprising a dielectric layer coupled to the top surface.

14. The SCM of claim 13, wherein the dielectric layer has a planar top surface.

15. A multi-chip module (MCM), comprising:
a first SCM, which includes:
   a first substrate having a first surface; and
   a first pad, disposed on the first surface, wherein the first pad has a top surface that includes a first pattern of features, and
   wherein a given feature in the first pattern of features has a first height that extends above a minimum thickness of the first pad; and
a second SCM, which includes:
   a second substrate having a second surface; and
   a second pad, disposed on the second surface, wherein the second pad has a top surface that includes a second pattern of features,
   wherein a given feature in the second pattern of features has a second height that extends above a minimum thickness of the second pad, and
   wherein the first pattern of features and the second pattern of features increase the capacitive coupling between the first pad and the second pad relative to a configuration in which the top surfaces of either or both of the first pad and the second pad are planar.

16. The MCM of claim 15, wherein the first pad and the second pad are aligned such that features in the first pattern of features are interdigited with features in the second pattern of features.

17. The MCM of claim 15, further comprising a dielectric layer between the first pad and the second pad.

18. The MCM of claim 15, wherein a ratio of a spacing between the top surface of the first pad and the top surface of the second pad to the first height or the second height is greater than or equal to one.

19. The MCM of claim 15, wherein the first pattern of features is periodic along a first direction in a plane defined by the top surface of the first pad; and
wherein the second pattern of features is periodic along a second direction in a plane defined by the top surface of the second pad.

20. A computer system, comprising:
an MCM, the MCM including:
   a first SCM, which includes:
      a first substrate having a first surface; and
      a first pad, disposed on the first surface, wherein the first pad has a top surface that includes a first pattern of features, and
      wherein a given feature in the first pattern of features has a first height that extends above a minimum thickness of the first pad; and
   a second SCM, which includes:
      a second substrate having a second surface; and
      a second pad, disposed on the second surface, wherein the second pad has a top surface that includes a second pattern of features,
      wherein a given feature in the second pattern of features has a second height that extends above a minimum thickness of the second pad, and
   wherein the first pattern of features and the second pattern of features increase the capacitive coupling between the first pad and the second pad relative to a configuration in which the top surfaces of either or both of the first pad and the second pad are planar.

* * * * *